(12) United States Patent
Chae et al.

(10) Patent No.: US 12,144,157 B2
(45) Date of Patent: Nov. 12, 2024

(54) CONVERTER

(71) Applicant: LG Electronics Inc., Seoul (KR)

(72) Inventors: Seungwoo Chae, Seoul (KR);
Taeyoung Park, Seoul (KR); Jinho Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 111 days.

(21) Appl. No.: 17/791,016

(22) PCT Filed: Jan. 5, 2021

(86) PCT No.: PCT/KR2021/000051
§ 371 (c)(1),
(2) Date: Jul. 6, 2022

(87) PCT Pub. No.: WO2021/141342
PCT Pub. Date: Jul. 15, 2021

(65) Prior Publication Data
US 2023/0052725 A1    Feb. 16, 2023

(30) Foreign Application Priority Data

Jan. 6, 2020 (KR) .......................... 10-2020-0001381

(51) Int. Cl.
*H05K 7/20* (2006.01)
*H02M 7/00* (2006.01)

(52) U.S. Cl.
CPC ............ *H05K 7/209* (2013.01); *H02M 7/003* (2013.01)

(58) Field of Classification Search
CPC ............................... H05K 7/209; H02M 7/003

USPC ......................................................... 361/709
See application file for complete search history.

(56) References Cited

U.S. PATENT DOCUMENTS

| | | | | |
|---|---|---|---|---|
| 4,553,114 A | * | 11/1985 | English | ..................... H03H 1/00 333/182 |
| 5,107,186 A | * | 4/1992 | Ihara | ...................... H05B 41/00 361/674 |
| 6,459,586 B1 | * | 10/2002 | Miller | .................. H01F 17/043 336/61 |

(Continued)

FOREIGN PATENT DOCUMENTS

| | | |
|---|---|---|
| CN | 208157446 U  * | 11/2018 |
| EP | 0712266 | 5/1996 |

(Continued)

OTHER PUBLICATIONS

CN-208157446-U English translation (Year: 2018).*

(Continued)

*Primary Examiner* — Anatoly Vortman
(74) *Attorney, Agent, or Firm* — Fish & Richardson P.C.

(57) ABSTRACT

A converter for an air conditioner includes a substrate, an inductor that is disposed in one side of the substrate and includes a core and a coil wound around the core, a switching element that is disposed in one side of the substrate and selectively controls a flow of a circuit, and a heat sink for absorbing heat generated from the switching element by contacting the switching element. A lead-in hole is formed in one side of the substrate, and at least a portion of the inductor is disposed in the lead-in hole, thereby quickly discharging the heat generated by the inverter and more efficiently using a space.

20 Claims, 9 Drawing Sheets

(56) References Cited

U.S. PATENT DOCUMENTS

| | | | | |
|---|---|---|---|---|
| 7,498,917 | B1* | 3/2009 | Yang | H05K 1/18 336/212 |
| 7,791,888 | B2* | 9/2010 | Tominaga | H01L 25/072 361/708 |
| 9,445,525 | B2* | 9/2016 | Hara | H05K 7/20927 |
| 10,594,206 | B2* | 3/2020 | Wennerstrom | H01F 27/255 |
| 10,912,232 | B2* | 2/2021 | Nakajima | H02M 7/003 |
| 10,916,367 | B2* | 2/2021 | Fukui | H05K 1/165 |
| 2003/0161111 | A1* | 8/2003 | Yoshida | H01L 23/42 257/E23.087 |
| 2003/0174037 | A1* | 9/2003 | Hooey | H02M 7/003 336/61 |
| 2005/0121986 | A1* | 6/2005 | Matsuki | H05K 1/0203 310/58 |
| 2009/0253300 | A1* | 10/2009 | Huang | H01R 13/6633 439/620.05 |
| 2010/0164670 | A1* | 7/2010 | Nakahori | H01F 27/306 336/200 |
| 2012/0020025 | A1* | 1/2012 | Sotome | H01G 4/228 361/704 |
| 2013/0049550 | A1* | 2/2013 | Watanabe | F04B 39/121 310/67 R |
| 2013/0265723 | A1* | 10/2013 | Nagai | H05K 7/209 361/709 |
| 2015/0070845 | A1* | 3/2015 | Hara | H05K 7/20927 361/699 |
| 2018/0350514 | A1* | 12/2018 | Nakajima | H01F 27/2804 |

FOREIGN PATENT DOCUMENTS

| | | |
|---|---|---|
| EP | 2675054 | 12/2013 |
| JP | 2000014149 | 1/2000 |
| JP | 2012110156 | 6/2012 |
| KR | 10-2019-0092802 A | 8/2019 |
| KR | 10-2019-0139287 A | 12/2019 |

OTHER PUBLICATIONS

Extended European Search Report in European Appln. No. 21738892.5, mailed on Dec. 22, 2023, 12 pages.

Office Action in Korean Appln No. 10-2020-0001381, mailed on Jul. 3, 2024, 26 pages (with English Translation).

* cited by examiner

CONVERTER

CROSS-REFERENCE TO RELATED APPLICATIONS

This application is a National Stage application under 35 U.S.C. § 371 of International Application No. PCT/KR2021/000051, filed on Jan. 5, 2021, which claims the benefit of Korean Patent Application No. 10-2020-0001381, filed on Jan. 6, 2020. The disclosures of the prior applications are incorporated by reference in their entirety.

TECHNICAL FIELD

The present disclosure relates to a converter, and more particularly, to a converter for an air conditioner.

BACKGROUND ART

An air conditioner is an apparatus that maintains indoor air in a comfortable state. An air conditioner means only a cooling apparatus in a narrow sense, but recently, there is an apparatus equipped with a heating function, and thus, it may mean a cooling and heating apparatus in a broad sense. The air conditioner exchanges heat with a refrigerant and maintains the indoor air in a comfortable state.

The air conditioner includes a compressor for compressing a refrigerant, an outdoor heat exchanger for heat-exchanging the refrigerant with outdoor air, an expansion valve for expanding the refrigerant, and an indoor heat exchanger for heat-exchanging the refrigerant with indoor air. When the refrigerant of the air conditioner is circulated in one direction, cooling operation may be performed, and when the refrigerant is circulated in the opposite direction, heating operation may be performed.

The air conditioner is generally operated by receiving power. The air conditioner needs to convert the received power into an appropriate power to operate by the received power, and has at least one power conversion device to convert the power.

The power conversion device is a device that converts input power and supplies the converted power to each component. The power conversion device is disposed in the air conditioner to convert input power into an appropriate power for driving the air conditioner. The power conversion device includes a converter that converts AC power to DC power and an inverter that converts DC power to AC power.

Among power conversion devices, the converter is a device that changes power. In a narrow sense, the converter refers to a device that converts AC to DC, but in a broad sense, it may collectively refer to a device that converts DC to DC or AC, and converts AC to DC or AC.

The converter includes at least one or more of switching elements and inductors. The switching element is a device that rectifies AC to DC by turning a switch on/off according to the command of a controller, and is turned on/off many times in a short time, thereby generating heat. An inductor is a device that stores current, and as it is wound around with a long coil, heat is generated due to its own internal resistance.

The converter essentially generates heat in the switching element and the inductor. The generated heat deteriorates the efficiency of the switching element and the inductor, thereby causing a problem in the reliability of a device. Furthermore, there is a problem in that each component is overheated and damaged.

Accordingly, research for absorbing heat from the switching element and the inductor is being conducted, and FIGS. 4 and 5 illustrate a converter used in the related art. In the related art, a heat sink is disposed in one side of the switching element to absorb heat generated from the switching element and discharge the generated heat to the outside. However, the heat sink of the related art has a structure that absorbs only the heat of the switching element and cannot absorb the heat generated in the inductor, and there is a problem in that the circuit is damaged by the heat generated in the inductor.

DISCLOSURE

Technical Problem

The present disclosure has been made in view of the above problems, and provides a converter that effectively dissipates heat generated from an inductor. The present disclosure further provides a converter that efficiently utilizes a space.

Technical Solution

According to an embodiment of the present disclosure, there is provided a converter, including: a substrate; an inductor disposed in one side of the substrate, and comprising a core and a coil wound around the core; a switching element disposed in one side of the substrate, and selectively controlling a flow of a circuit; and a heat sink for absorbing heat generated from the switching element by contacting the switching element. A lead-in hole is formed in one side of the substrate, and at least a portion of the inductor is disposed in the lead-in hole.

The switching element is disposed in one side of the substrate, and the inductor is disposed in an opposite surface of the substrate in which the switching element is not disposed.

At least a portion of the heat sink is disposed to overlap the inductor.

The inductor includes a ring-shaped toroidal core and a toroidal coil wound along the toroidal core, and a center line passing through a center of a ring of the toroidal core is disposed parallel to the substrate.

The converter further includes a support member which is disposed between the inductor and the heat sink, supports the inductor, and exchanges heat between the inductor and the heat sink.

The inductor further includes a terminal line electrically connected to the substrate, and further includes at least one support ring disposed between the terminal line and the substrate.

According to a second embodiment, a center line passing through a center of a ring of a toroidal core may intersect with a substrate.

Provided is a power conversion device for an air conditioner having a converter according to an embodiment of the present invention.

Advantageous Effects

A converter of the present disclosure has one or more of the following effects.

First, since the inverter is disposed closer to the heat sink, there is an advantage of rapidly dissipating heat generated in the inverter through the heat sink.

Second, there is an advantage in that since a part of the inverter having a considerable volume is inserted into the substrate, a space can be efficiently utilized by reducing the size of the converter.

The effects of the present disclosure are not limited to the effects mentioned above, and other effects not mentioned can be clearly understood by those skilled in the art from the description of the claims.

MODE FOR INVENTION

Figure 1:
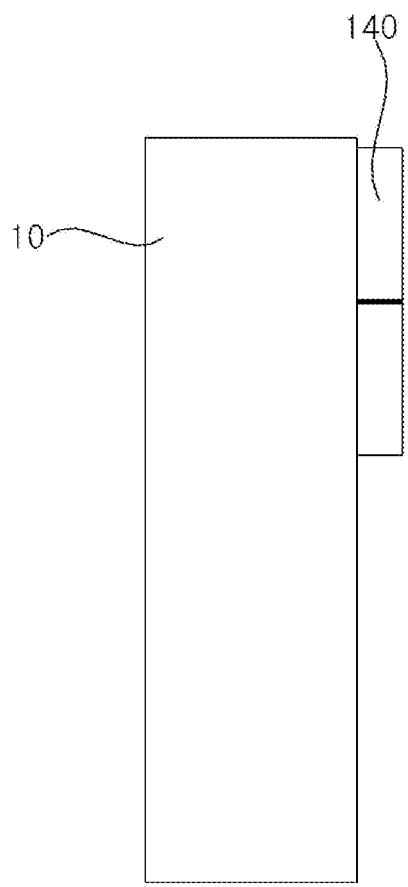
FIG.1 is a front view of a control box in which a converter is disposed.

Hereinafter, preferred embodiments of the present disclosure will be described with reference to the accompanying drawings. In describing the present embodiment, the same designations and the same reference numerals are used for the same components, and further description thereof will be omitted.

Hereinafter, the present disclosure will be described with reference to the drawings for describing a converter 100 according to embodiments of the present disclosure.

An up-down direction is defined as a direction perpendicular to both sides of a substrate 110. An upward direction is defined as a direction in which an upper surface of the converter 100 is located in comparison with a bottom surface. A downward direction is the opposite direction to the upward direction. The upward direction may be defined as z-axis.

A left-right direction is one side direction of the extending direction of the substrate 110, and defined as a direction passing through an inductor 120 and a switching element 130 at the same time. The left-right direction may be defined as a horizontal direction. The right direction is a direction in which the switching element 130 is positioned based on the inductor 120. A left direction is the opposite direction to the right direction, and is a direction in which the inductor 120 is positioned based on the switching element 130. The right direction may be defined as x-axis.

Figure 6:
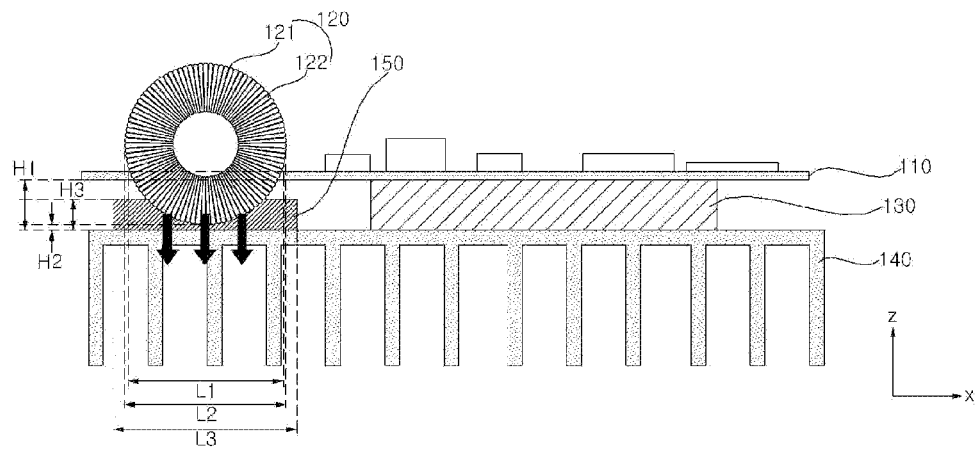
FIG.6 is a front view according to a first embodiment of the present disclosure.

A front-rear direction is one side direction of the extending direction of the substrate 110, and is a direction that is orthogonal to the x-axis and the z-axis according to the right-hand rule. The front-rear direction may be defined as a longitudinal direction. A front direction is defined in the same direction as shown in FIG.6. A rear direction is the opposite direction to the front direction. The rear direction may be defined as y-axis.

An air conditioner is an apparatus that sucks air, converts the sucked air into a comfortable state, and discharges the converted air to maintain the indoor air in a comfortable state. The air conditioner may change the temperature of the air, change the humidity of the air, or purify the air to maintain a comfortable state.

The air conditioner includes a compressor that compresses a refrigerant, an outdoor heat exchanger that heat-exchanges refrigerant with the outdoor air, an expansion valve that expands the refrigerant, and an indoor heat exchanger that heat-exchanges the refrigerant with the indoor air. When the refrigerant of the air conditioner is circulated in one direction, cooling operation may be performed. When the refrigerant is circulated in the opposite direction, heating operation may be performed.

The air conditioner is generally operated by receiving an external power. The supplied power may operate a pump, operate a compressor, operate an electrostatic filter, or operate a processor for control. The air conditioner must convert the received power into an appropriate power to operate, and includes at least one power conversion device to convert the power.

A power conversion device is an apparatus that converts the input power into a voltage or current as required. The air conditioner is equipped with a power conversion device to convert power into a required voltage or current. To this end, the power conversion device may include a converter 100 that converts the received AC power into DC power and outputs the DC power, a capacitor connected to an output terminal of the converter 100, an inverter (not shown) that converts DC power into AC power, and a controller (not shown) to control these components. The power conversion device may further include a communication unit (not shown) for communication with an external gateway.

Figure 2:
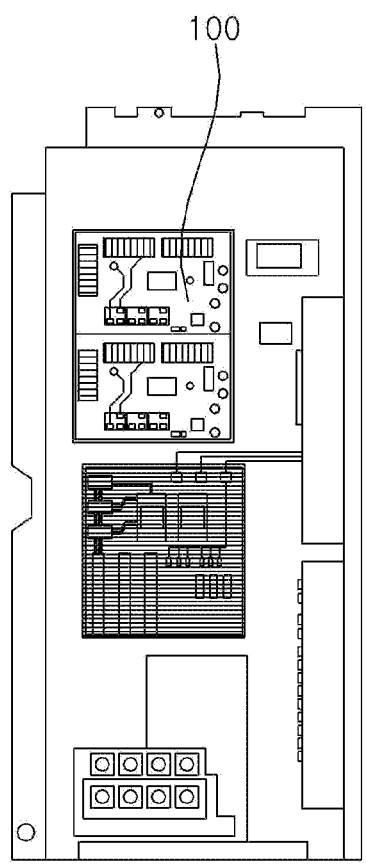
FIG.2 is a plan view when viewed from a top after removing an upper cover of the control box of FIG.1.
Figure 3:
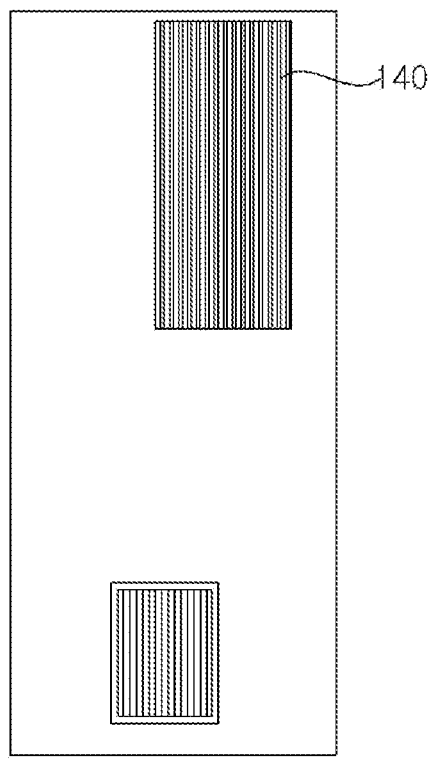
FIG.3 is a bottom view of the control box of FIG.1.

FIG.1 is a diagram showing a control box of an air conditioner. More specifically, FIG.1 is a front view of the control box, FIG.2 is a plan view when viewed from a top after removing an upper cover of the control box, and FIG.3 is a bottom view when viewed from a bottom of the control box. The power conversion device may be disposed in a control box. The control box may be one assembly in which devices for controlling the air conditioner are disposed. The control box may include a processor. The control box may easily supply power to the processor by disposing a power conversion device adjacent to the processor, and individually supply power to a plurality of devices outside the control box.

The converter 100 is a component constituting the power conversion device, and is an apparatus that converts the state of input power. AC power may be converted into DC power and output. For this purpose, the converter 100 may include a rectifier. In addition, a reactor (not shown) may be further provided. A capacitor may store a power output from the converter 100. Since the power output from the converter 100 is DC power, the capacitor disposed in the outlet end of the converter 100 may be referred to as a DC terminal capacitor.

In a narrow sense, the converter 100 may be considered as a device that converts AC power into DC power, and the inverter may be considered as a device that converts DC power into AC power.

The converter 100 includes an inductor 120. The inductor 120 is a device that stores current. An inductor product generally used in a general industry may be used as the inductor 120.

The inductor 120 has the property of a shock absorber.

When a variable current is applied, the inductor 120 stores a part of the current. When the applied current becomes strong, the inductor 120 stores a part of the applied current, and when the applied current becomes weak, the inductor 120 discharges a part of the stored current. The inductor 120 may converge a variable current to a constant value.

In the inductor 120, a current flows along a coil 122 wound around a core 121. The coil 122 has a considerable length, and when current flows, heat may be generated due to the internal resistance of the coil 122. In addition, as the number of turns of the coil 122 increases, the amount of generated heat increases proportionally. Therefore, as heat is generated in the inductor 120, the internal resistance of the coil 122 also increases, causing a problem in reliability. Further, there is a problem in that the inductor 120 and other devices are damaged due to heat generated in the inductor 120.

The converter 100 includes a plurality of switching elements 130. The switching elements 130 in the converter 100 may operate to on/off based on a signal from the controller. Accordingly, voltage or current may be converted. When AC power is applied to the converter 100, the plurality of elements 130 repeat on/off according to a signal from the controller, and accordingly, the AC power may be rectified to DC power. As described above, when the switching elements repeat on/off, heat is inevitably generated, and if the generated heat is not rapidly dissipated, it is apprehended that the switching element 130 or other devices may be damaged.

For example, the converter 100 may include an insulated gate bipolar transistor (IGBT), which is a type of the switching element 130. The IGBT is a power device that combines a metal oxide semiconductor field effect transistor (MOSFET) and a bipolar junction transistor (BJT) which has conduction loss and high breakdown voltage even at low currents and is capable of accomplishing a high current driving. IGBT has the advantage of having a fast switching speed, but has a problem that the amount of generated heat increases as the switching speed is fast.

In order to dissipate the heat generated by the switching element 130, the converter 100 may include a heat sink 140. FIG. 1 shows a generally used control box. The heat sink 140 may be disposed in an outer surface of one side of the case 10 of the control box. The heat sink 140 may be disposed in a position opposite to the switching element 130 while the case 10 is interposed therebetween. Thus, the heat generated in the switching element 130 may be conducted to the case 10 and may be conducted to the heat sink 140 to be discharged to the outside.

The controller may output a control signal for controlling the switching elements 130 of the converter 100. The controller may output a control signal for controlling the switching elements 130 of the converter.

Figure 7:
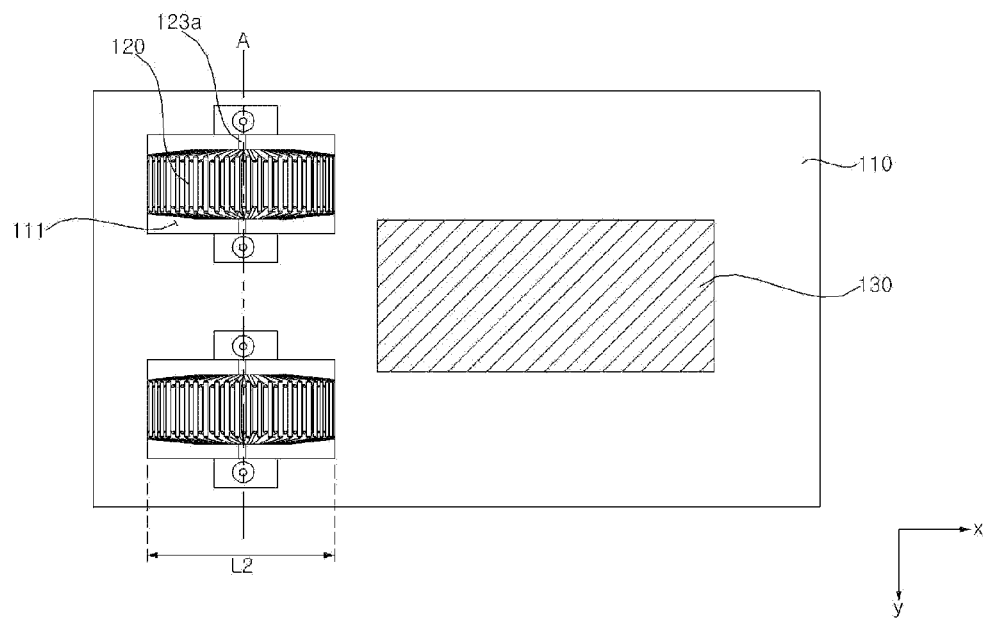
FIG.7 is a bottom view according to a first embodiment of the present disclosure.

The converter 100 according to the present disclosure will be described with reference to FIGS. 6 and 7.

The converter 100 may be disposed in the control box. The converter 100 may be disposed in the case 10 of the control box. The converter 100 may be disposed in an inner surface of one side of the case 10.

The converter 100 includes a substrate 110. The substrate 110 is a plate for fixing circuit elements and electrically connecting the circuit elements. The substrate 110 may be a printed circuit board (PCB) plate. A substrate product widely used in the market may be used as the substrate 110.

The substrate 110 may be disposed in one side of the case 10. The substrate 110 may be disposed in an inner surface of a wall disposed behind the case 10. The substrate 110 may be disposed parallel to the rear of the case 10.

The substrate 110 may be disposed in both sides of the switching element 130 while the switching element 130 is interposed therebetween.

The substrate 110 may have a lead-in hole 111 so that an inductor may be disposed.

The converter 100 includes a switching element 130. The switching element 130 may be disposed in one side of the substrate 110 to be electrically connected. The switching element 130 may be disposed in the lower surface of the substrate 110.

The switching element 130 may be disposed in a different surface from the other electrical devices. If other electrical devices are disposed in the upper surface of the substrate 110, the switching element 130 may be disposed in the lower surface of the substrate 110. The switching element 130 may be disposed in a different surface from other electrical devices so that heat generated in the switching element 130 does not affect other electrical devices.

The converter 100 includes a heat sink 140. The heat sink 140 is disposed in contact with the switching element 130 to absorb heat of the switching element 130.

The heat sink 140 may be disposed parallel to the substrate 110.

A substrate 110 may be positioned in one side of the switching element 130, and the heat sink 140 may be positioned in the other side.

The heat sink 140 may be disposed below the switching element 130.

The heat sink 140 may be spaced apart from the substrate 110 and may be disposed parallel to the substrate 110.

The heat sink 140 may include a plurality of radiation fins protruding vertically in the extending direction. The plurality of radiation fins may increase the surface area of the heat sink 140, thereby discharging heat to the outside more quickly.

At least a portion of the heat sink 140 is disposed to overlap the switching element 130. That is, all portions of one side surface of the switching element 130 are in contact with the heat sink 140, so that heat is quickly transferred to the heat sink 140.

At least a portion of the heat sink 140 may be disposed to overlap the inductor 120. That is, when viewed from the top, all portions of the cross-sectional area of the inductor 120 may overlap the heat sink 140. Therefore, the heat generated from the inductor 120 may be quickly conducted to the heat sink 140.

The horizontal length of the heat sink 140 may be longer than the horizontal length of the substrate 110.

The converter 100 includes an inductor 120. The inductor 120 may be disposed in the substrate 110 and may be electrically connected to the substrate 110. The inductor 120 may store a part of the current flowing through the substrate 110, and when the current is variable, may discharge a part of the stored current to uniformly maintain the current.

The inductor 120 may be disposed in the opposite side of the substrate 110 on which the switching element 130 is not disposed. The inductor 120 is disposed in the opposite side of the switching element 130 with the substrate 110 as a center. The inductor 120 may be disposed in the same surface as other devices excluding the switching element 130. The inductor 120 is a device that generates heat, and may be affected by heat generated from the switching element 130. Therefore, it is preferable to be disposed in the opposite side of the switching element 130.

The inductor 120 may be formed in various shapes. For example, as in the present disclosure, the inductor 120 may be formed in the shape of the toroidal coil 122. However, the shape of the inductor 120 is not limited to the present embodiment, but the shape of the inductor 120 can be changed within a range that can be easily changed by an ordinary skilled person.

Hereinafter, the shape of the inductor 120 will be described based on the shape of the toroidal coil 122.

The inductor 120 according to the present disclosure includes a ring (loop)-shaped toroidal core 121 and a toroidal coil 122 wound along the circumference of the toroidal core 121. The toroidal coil 122 has a center line A passing through the center of the ring.

According to a first embodiment, the center line A passing through the inductor 120 may be disposed parallel to the substrate 110. That is, at this time, the toroidal core 121 is disposed perpendicular to the substrate 110.

According to a second embodiment, the center line A passing through the inductor 120 may perpendicularly intersect with the substrate 110. That is, in this case, the toroidal core 121 is disposed parallel to the substrate 110.

The inside of the toroidal coil 122 does not generate an electric field.

A terminal line 123 protrudes from one side of the toroidal coil 122. The terminal line 123 is electrically connected to the substrate 110. When the inductor 120 is disposed to be spaced apart from the substrate 110, the terminal line 123 may support the inductor 120 while electrically connecting the inductor 120 and the substrate 110.

A lead-in hole 111 is formed in one side of the substrate 110, and at least a portion of the inductor 120 may be disposed in the lead-in hole 111.

The lead-in hole 111 is formed to penetrate the substrate 110.

According to the first embodiment, the lead-in hole 111 may be formed in a rectangular shape when viewed from the top. According to the second embodiment, the lead-in hole 111 may be formed in a circular shape when viewed from the top.

The longitudinal direction is defined as a direction in which the center line of the inductor faces, and according to the first embodiment, the length of the lead hole 111 may be formed to be larger than the length of the outer circumferential surface 125 of the inductor. Therefore, the inductor 120 may be inserted into the lead-in hole 111 and disposed.

According to the first embodiment, the horizontal length L1 of the lead-in hole may be smaller than the diameter of a side surface 126 of the inductor. Since the diameter of the side surface 126 of the inductor can be regarded as the same as the horizontal length L2 of the inductor, the horizontal length L1 of the lead-in hole may be smaller than the horizontal length L2 of the inductor when viewed from the top. Therefore, at least a portion of the inductor 120 may be inserted into the lead-in hole 111 and disposed, and the inductor 120 cannot pass through the lead-in hole 111.

According to the second embodiment, it can be said that the diameter of the lead-in hole is the same as the horizontal length L1 of the lead-in hole when viewed from the front, and the diameter of the side surface of the inductor is the same as the horizontal length L2 of the inductor. In other words, the diameter of the lead-in hole may be larger than the diameter of the side surface of the inductor. Accordingly, the inductor may be positioned horizontally and at least a portion of the inductor may be inserted into the lead-in hole and disposed.

The center line A of the inductor is disposed in the upper side of the substrate 110. The center line A of the inductor is disposed in the opposite side of the switching element 130 with respect to the substrate 110.

When the shortest distance between the heat sink and the inductor is defined as H2, H2 may be formed closer than the distance H1 between the heat sink and the substrate. The height ranging from the heat sink to the inductor H may be shorter than the height ranging from the heat sink to the substrate H1. By making the height H2 from the heat sink to the inductor shorter than the height H1 from the heat sink to the substrate, there is an effect that heat generated from the inductor 120 can be transferred to the heat sink 140 through convection.

A support member 150 is a device that supports the inductor 120 and exchanges heat between the inductor 120 and the heat sink 140.

The inductor 120 is mounted on the support member 150.

The heat sink 140 is disposed in the lower side of the support member 150, and the inductor 120 is disposed in the upper side of the support member 150. The lower side of the support member 150 is coupled to the heat sink 140, and the inductor 120 is mounted on the upper side of 150 and fixed.

One side of the support member 150 may be coupled to the heat sink 140, and the other side of the support member 150 may support at least a portion of the retracted portion of the inductor 120.

The support member 150 may be formed of a member that easily transfers heat. The support member may be formed of a material having a large thermal conductivity.

Figure 4:
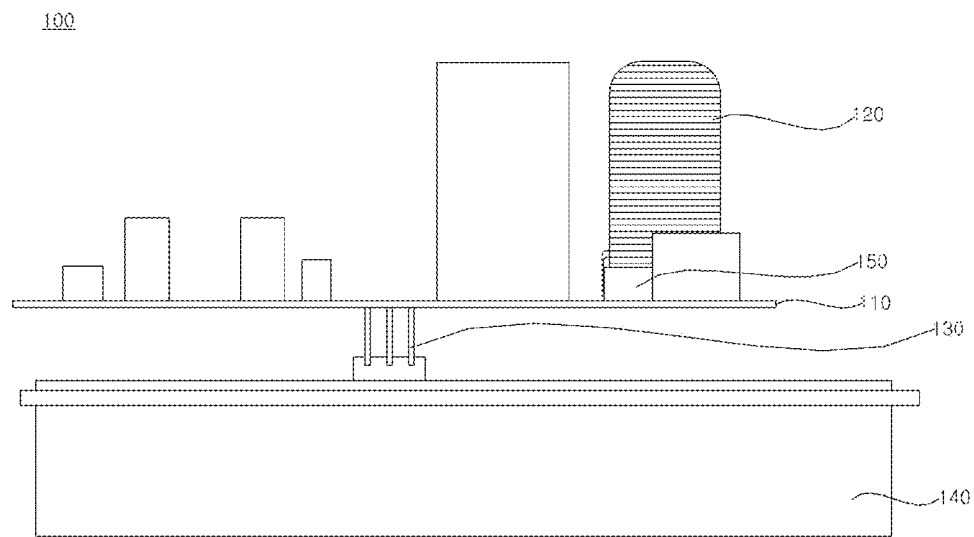
FIG.4 is a rear view showing a converter according to a related art.
Figure 5:
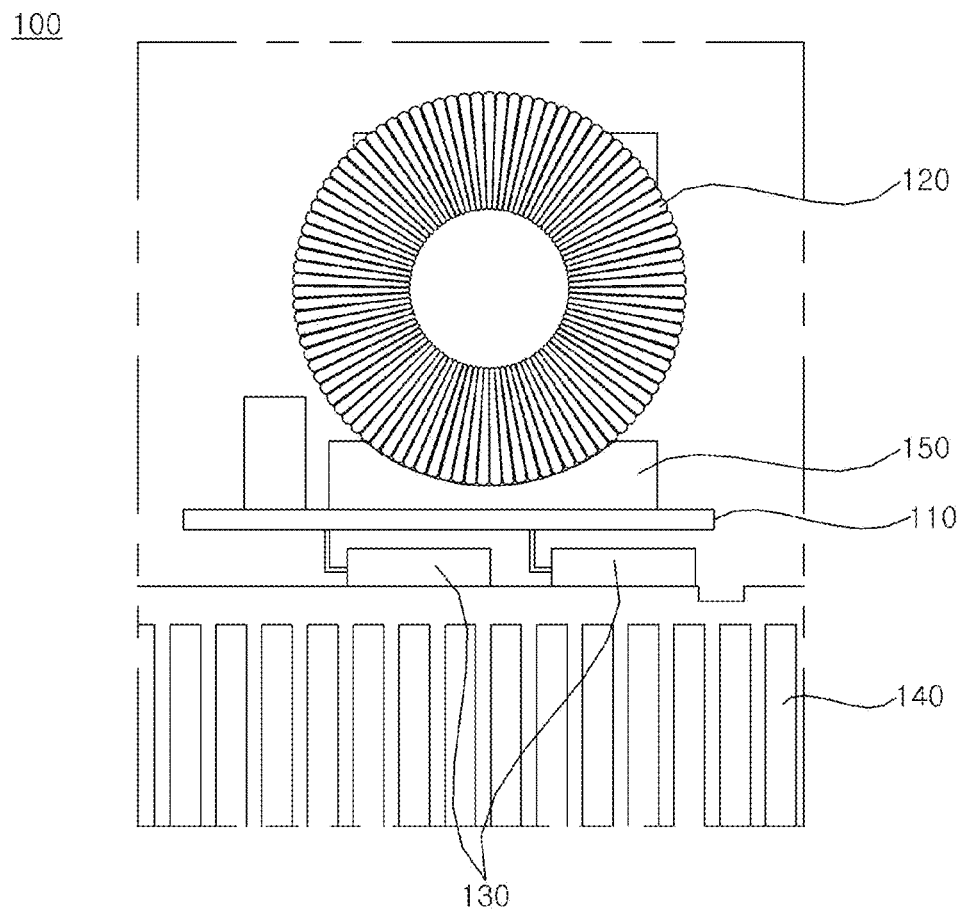
FIG.5 is a right side view of the converter according to the related art of FIG.4.

Unlike the present disclosure, the conventional support member shown in FIGS. 4 and 5 is made of an insulating material. This is because when heat generated from the conventional inductor 120 is transferred to the substrate 110, the heat damages other devices. However, unlike the conventional support member, the support member 150 of the present disclosure is composed of a heat transfer member, and has an effect of quickly transferring heat generated from the inductor 120 to the heat sink 140.

The height H3 from the heat sink to the support member may be lower than the height H1 from the heat sink to the substrate. If the height H3 from the heat sink to the support member is the same as the height H1 from the heat sink to the substrate, in other words, if the support member 150 contacts the substrate 110, it is apprehended that heat generated from the inductor 120 and transferred to the support member 150 is transferred to the substrate 110, thereby damaging other devices. Accordingly, it is preferable that the height H3 from the heat sink to the support member is lower than the height H1 from the heat sink to the substrate.

The height H3 from the heat sink to the support member may be higher than the shortest distance H2 between the heat sink and the inductor. While maintaining the height H3 from the heat sink to the support member, the height may be temporarily lowered at the shortest distance H2 between the heat sink and the inductor, thereby having the effect of seating the inductor 120.

A groove may be formed in the upper surface of the support member 150 so that the inductor 120 can be seated.

The horizontal length L3 of the support member may be longer than the horizontal length L1 of the lead-in hole. The horizontal length L3 of the support member may be longer than the horizontal length L2 of the coil.

The terminal line 123 is a component that protrudes from the inductor 120 and electrically connects the inductor 120 and the substrate 110. At the same time, the terminal line 123 may support the inductor 120.

Figure 8:
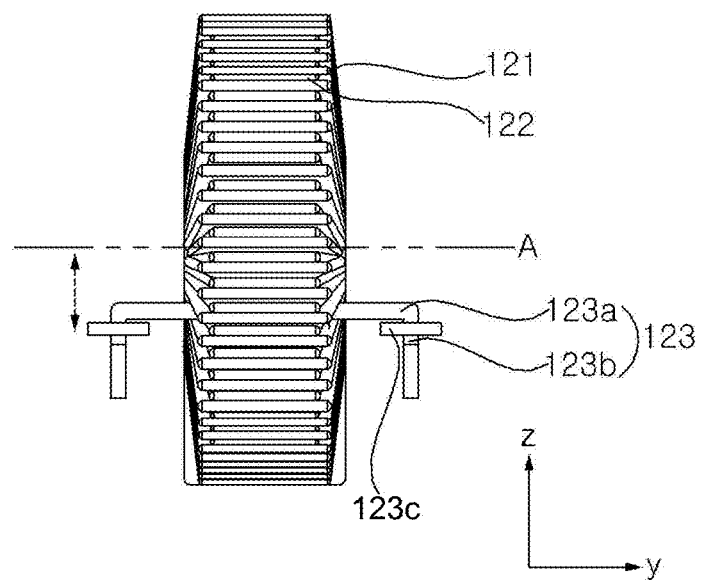
FIG.8 is a diagram showing an inductor according to a first embodiment of the present disclosure.

Referring to FIG.8, the terminal line 123 may protrude from a part of the coil 122 according to the first embodiment.

Two terminal lines 123 protrude. The terminal lines 123 protrude from both side surfaces 126 of the inductor, respectively, and may support the inductor 120 from both sides.

The terminal lines 123 are connected to the front substrate 110 of the lead-in hole and the rear substrate 110 of the lead-in hole, respectively, and may support the inductor 120 from both sides.

The terminal line 123 may include a horizontal portion 123a extending horizontally, and a vertical portion 123b bent at the horizontal portion 123a to extend vertically and electrically connected to the substrate 110.

The horizontal portion 123a may protrude in opposite direction respectively from both side surfaces 126 of the inductor.

The vertical portion 123b may extend vertically downward from a tip of the horizontal portion 123a.

A support ring 123c may be disposed in the terminal line 123.

The support ring 123c may be disposed in the vertical portion 123b. The support ring 123c has a hole in the center, and the vertical portion 123b may be inserted therein. The support ring 123c may be formed in a C-shape, and the vertical portion 123b may be inserted into the center. The support ring 123c may surround at least a portion of the outer circumferential surface of the vertical portion 123b.

The upper surface of the support ring 123c may contact the horizontal portion 123a to support at least a portion of the horizontal portion 123a.

The shape of the support ring 123c may be variously formed within a range that can be easily changed by a person skilled in the art.

A plurality of support rings 123c may be disposed. The height of the inductor 120 may be changed by installing a plurality of support rings 123c as necessary.

Hereinafter, a converter 100 according to a second embodiment will be described with reference to FIGS. 9 and 10.

Unlike the converter 100 according to the first embodiment, the inductor 120 according to the second embodiment is disposed horizontally. Hereinafter, a side surface 126a positioned at the higher side of the side surface 126 of the inductor is referred to as an upper surface of the inductor 120, and the side surface 126b positioned at the lower side is referred to as a lower surface of the inductor 120.

The description of the converter 100 according to the second embodiment may be used within a range that does not conflict with the converter 100 according to the first embodiment. Hereinafter, the converter 100 according to the second embodiment will be focused on differences from the first embodiment.

In the converter 100 according to the second embodiment, the center line A passing through the center of the inductor 120 intersect with the substrate 110. More specifically, the center line A may be orthogonal to the substrate 110. In other words, the toroidal core 121 may be parallel to the substrate 110. Alternatively, the toroidal core 121 may be disposed parallel to the heat sink 140.

In the first embodiment, the toroidal core 121 is disposed vertically with respect to the substrate 110, so it occupies a space upwardly and downwardly. However, in the second embodiment, the toroidal core 121 and the substrate 110 are disposed horizontally, so it occupies a less space upwardly and downwardly, but there is a difference that it occupies more space left and right.

According to the second embodiment, a lead-in hole 111 is formed in one side of the substrate 110, and at least a portion of the inductor 120 may be disposed in the lead-in hole 111.

The lead-in hole 111 may be formed in a circular shape when viewed from the top.

Since the diameter of the side surface 126 of the inductor can be regarded as the same as the width L2 of the coil, the diameter of the lead-in hole 111 may be larger than the diameter of the side surface 126 of the inductor. Accordingly, the inductor 120 may be inserted into the lead-in hole 111.

Figure 9:
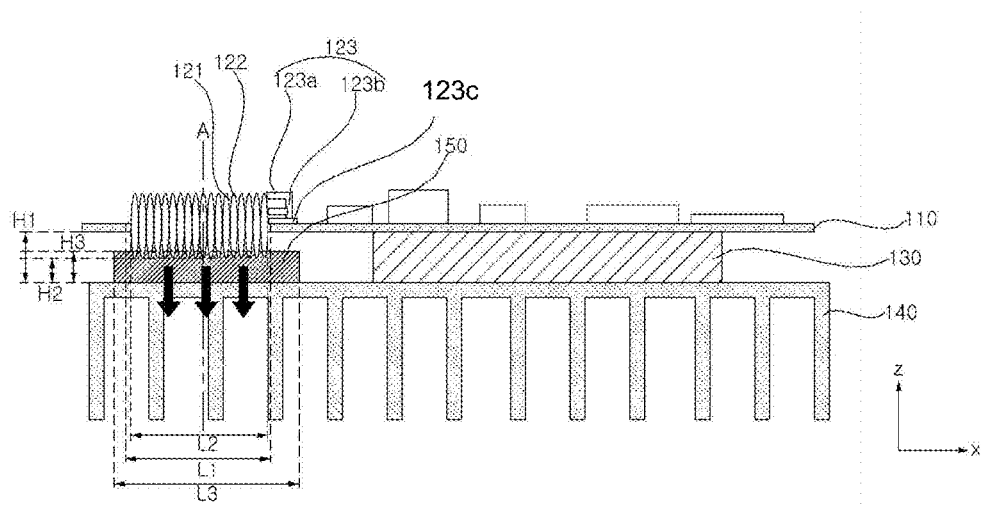
FIG.9 is a front view according to a second embodiment of the present disclosure.

Referring to FIG.9, a portion of the inductor 120 that is inserted into the lead-in hole 111 may not exceed ½ of the height of the inductor 120.

According to the second embodiment, one side of the support member 150 may be coupled to the heat sink 140 and the other side may support the side surface 126 of the inductor. More specifically, the lower side of the support member 150 is coupled to the upper side of the heat sink 140, and the upper side may support the lower surface 126b of the inductor.

Figure 10:
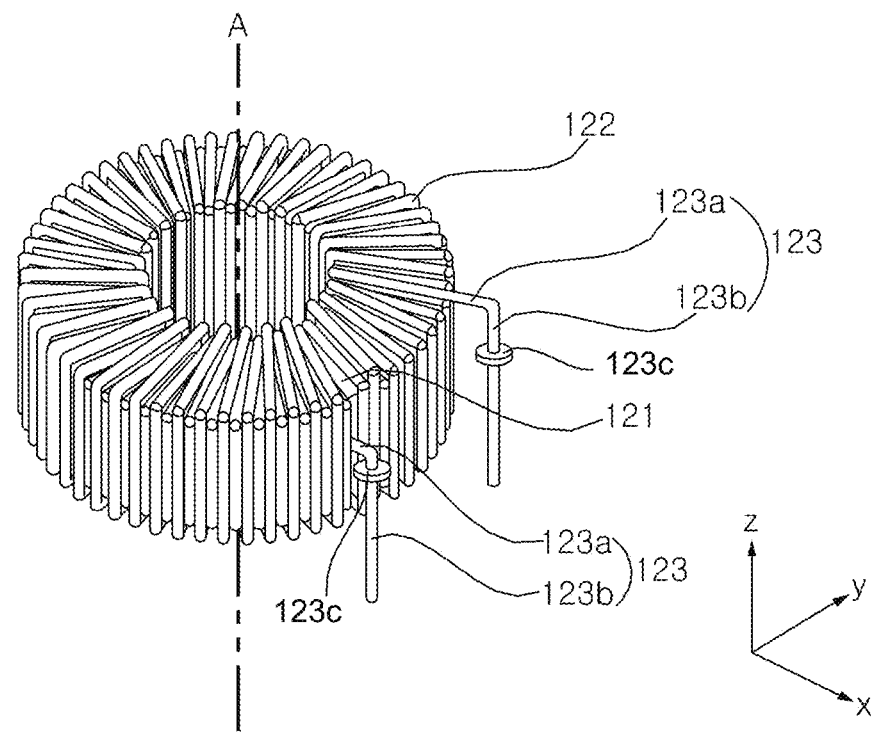
FIG.10 is a diagram showing an inductor according to a second embodiment of the present disclosure.

Referring to FIG.10, the terminal line 123 according to the second embodiment may protrude from a portion of the coil 122.

Referring to FIGS. 9 and 10, the terminal line 123 may protrude from the outer circumferential surface 125 between the upper and lower surfaces of the inductor 120 or may protrude from the upper surface 126a of the inductor.

When the terminal line 123 protrudes from the outer circumferential surface 125 of the inductor, as in the first embodiment, the support ring 123c surrounds at least a portion of the outer circumferential surface of the vertical portion 123b, and may support at least a portion of the horizontal portion 123a.

When the terminal line 123 protrudes from the upper surface 126a of the inductor, the support ring 123c surrounds at least a portion of the outer circumferential surface of the vertical portion 123b, but cannot support the horizontal portion 123a. According to the embodiment shown in FIG.9, at this time, the inductor 120 may be supported by forcibly fitting the support ring 123c to the vertical portion 123b. Although not shown, according to another embodiment, the support rings 123c are arranged in such a manner that the number of support rings 123c disposed in the terminal line protruding from the upper surface 126a of the inductor is larger than the number of support rings disposed in the terminal line protruding from the outer circumferential surface 125 of the inductor, thereby supporting the horizontal portion 123a protruding from the upper surface 126a of the inductor.

Although not shown, in the terminal line 123, two terminal lines 123 do not protrude from one side of the inductor 120 as shown in FIG.10, but the terminal line 123 may protrude from both sides of the inductor 120 in opposite directions respectively.

Although not shown, in the terminal line 123, unlike those shown in FIG.10, two terminal lines 123 may protrude only from the outer circumferential surface 125 between the upper and lower surfaces of the inductor 120. Alternatively, two terminal lines 123 may protrude only from the upper surface 126a of the inductor.

In the second embodiment, unlike the first embodiment, since the inductor 120 is horizontally laid, there is a disadvantage that the left-right length of the conductor may be increased, but there is an advantage that the bottom-top height may be decreased.

In the second embodiment, unlike the first embodiment, since the inductor 120 is horizontally laid, the area overlapping between the inductor 120 and the heat sink 140 is wider. Accordingly, there is an advantage that heat can be dissipated more quickly.

The converter 100 may be disposed in the power conversion device or the control box. In this case, the heat sink 140 may be manufactured separately from the converter 100 so that the converter 100 is disposed inside the power conversion device or the control box and the heat sink 140 is disposed outside the control box.

The power conversion device or control box may include a case 10 forming an inner space.

The substrate 110 may be disposed inside the case 10.

The inductor 120 is disposed in one side of the substrate 110, and may include a core 121 and a coil 122 wound around the core 121.

The switching element 130 is disposed in one side of the substrate 110 to be electrically connected to the substrate 110, and has one side in contact with the inner surface of the case 10, and can selectively control the flow of a circuit.

The heat sink 140 is coupled to the outer surface of the case 10 with which the switch element 130 is in contact, and absorbs heat generated from the switching element 130. With the case 10 interposed therebetween, the switching element 130 may contact the inner surface of the case 10, and the heat sink 140 may contact the outer surface of the case 10. At least a portion of the switching element 130 and the heat sink 140 may be formed disposed to be overlapped based on the case 10.

The shortest distance between the case 10 and the inductor 120 may be shorter than the distance between the case 10 and the substrate 110.

A lead-in hole 111 may be formed in one side of the substrate 110, and at least a portion of the inductor 120 may be disposed in the lead-in hole 111.

The support member 150 may be disposed between the inductor 120 and the case 10, and support the inductor 120. One side of the support member 150 may be coupled to the inductor 120, and the other side may contact the case 10.

The height ranging from the case 10 to the upper surface of the support member 150 may be lower than the height ranging from the case 10 to the substrate 110.

One side of the support member 150 may be in contact with the inner surface of the case 10, and the other side may support at least a portion of the retracted portion of the inductor 120. The support member 150 may exchange heat between the inductor 120 and the case 10 and transfer heat from the inductor 120 to the heat sink 140 through the case 10.

Figure 11:
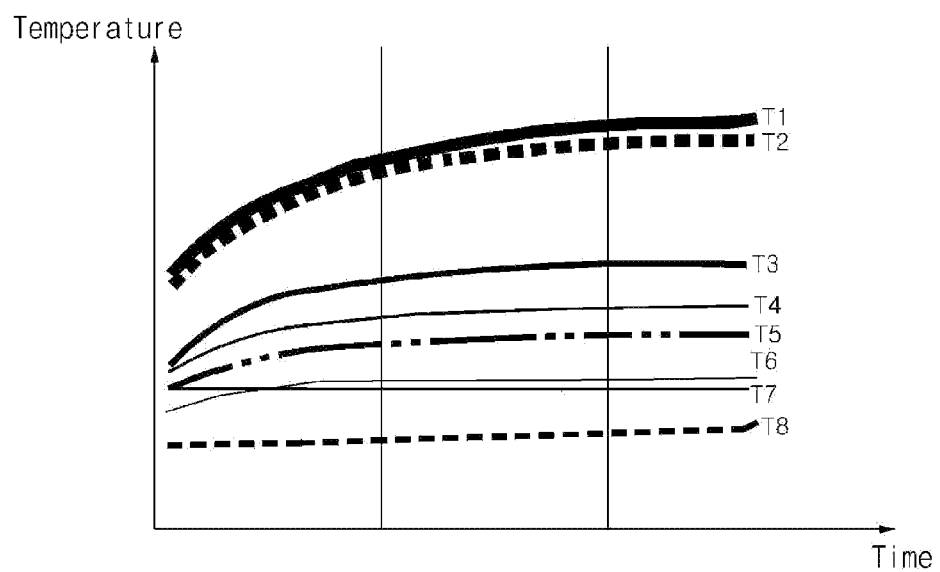
FIG.11 is a graph showing the effect according to the present disclosure in axes of time and temperature.

FIG.11 is a graph denoting the temperature of each component over time in order to show the effect according to the present disclosure.

T1 and T2 denote the temperatures of inductor 1 and inductor 2 according to the related art. T3 denotes the temperature of inductor 3 vertically disposed according to the first embodiment. T4 denotes the temperature of inductor 4 horizontally disposed according to the second embodiment.

T5 denotes the internal temperature, when the inductor 1 and the inductor 2 are disposed in one case 10. T6 denotes internal air temperature, when the inductor 3 according to the first embodiment and the inductor 4 according to the second embodiment are disposed in one case 10.

T7 denotes the temperature of the switch element, T8 denotes the temperature of the heat sink, and there is no significant difference between the related art and the embodiments of the present disclosure.

Since T1 and T2 are higher than T3 which is the result of the first embodiment or T4 which is the result of the second embodiment, according to the present disclosure, there is an effect of rapidly dissipating heat generated from the inverter to achieve cooling.

Since T4, which is the result of the second embodiment, is lower than T3, which is the result of the first embodiment, the overlapping area of the inductor and the heat sink increases, so that heat is discharged more quickly to cool the inductor.

For example, according to experiment, the temperature of the inductor according to the related art was measured at 120 degrees Celsius, and at this time, the temperature of the heat sink was measured at about 35 degrees Celsius. However, since the temperature of the inductor according to the first embodiment of the present disclosure was measured at 92 degrees Celsius, there is an effect of about 30% improvement in comparison with the related art.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A converter comprising:

a substrate;

an inductor disposed at a first side of the substrate, the inductor comprising a core and a coil that is wound around the core;

a switching element disposed at the substrate and configured to control a flow of current to the substrate; and a heat sink that is in contact with the switching element and configured to absorb heat generated from the switching element, wherein the substrate defines a lead-in hole that receives at least a portion of the inductor at the first side of the substrate, wherein the inductor further comprises a terminal line that is electrically connected to the substrate, wherein the terminal line comprises:

a horizontal portion that protrudes from the coil and extends in a horizontal direction parallel to the substrate, and a vertical portion that is bent from the horizontal portion, and electrically connected to the substrate, and wherein the converter further comprises at least one support ring that is disposed between the horizontal portion of the terminal line and the substrate, that surrounds at least a portion of an outer circumferential surface of the vertical portion, and that supports at least a portion of the horizontal portion, the at least one support ring defining a height of the inductor from the substrate.

2. The converter of claim 1, wherein the switching element is disposed at a second side of the substrate that is opposite to the first side of the substrate.

3. The converter of claim 1, wherein at least a portion of the heat sink is disposed at a position facing the inductor.

4. The converter of claim 3, wherein a distance between the heat sink and the inductor is shorter than a distance between the heat sink and the substrate.

5. The converter of claim 1, wherein the core of the inductor is a toroidal core, and the coil of the inductor is a toroidal coil wound along the toroidal core, and
wherein the substrate is parallel to a center line passing through a center of the toroidal core.

6. The converter of claim 5, wherein the center line is disposed at an opposite side of the switching element with respect to the substrate.

7. The converter of claim 1, further comprising a support member that is disposed between the inductor and the heat sink and supports the inductor, the support member being configured to exchange heat between the inductor and the heat sink.

8. The converter of claim 7, wherein the inductor comprises a retracted portion that extends downward toward the heat sink through the substrate, and
wherein the support member has a first surface that is coupled to the heat sink and a second surface that supports at least a portion of the retracted portion of the inductor.

9. The converter of claim 7, wherein a height from the heat sink to an upper surface of the support member is less than a height from the heat sink to the substrate.

10. The converter of claim 1,
wherein the at least one support ring comprises a plurality of support rings that are disposed between the horizontal portion of the terminal line and the substrate to thereby adjust the height of the inductor from the substrate.

11. The converter of claim 1,
wherein the at least one support ring is in contact with at least the portion of the horizontal portion.

12. The converter of claim 1, wherein the core of the inductor is a toroidal core, and the coil of the inductor is a toroidal coil wound along the toroidal core, and
wherein the substrate intersects a center line passing through a center of the toroidal core.

13. The converter of claim 12, wherein the toroidal core has a surface that is parallel to the heat sink.

14. The converter of claim 12, further comprising a support member having a first surface that is coupled to the heat sink and a second surface that supports a side surface of the inductor.

15. A converter comprising:
a substrate that defines a lead-in hole;
an inductor disposed at the substrate, the inductor comprising a core and a coil that is wound around the core;
a switching element disposed at the substrate and configured to control a flow of current to the substrate; and
a heat sink that is in contact with the switching element and configured to absorb heat generated from the switching element,
wherein at least a portion of the inductor is disposed in the lead-in hole,
wherein the inductor further comprises a terminal line that is electrically connected to the substrate,
wherein the terminal line comprises:
a horizontal portion that protrudes from the coil and extends in a horizontal direction parallel to the substrate, and
a vertical portion that is bent from the horizontal portion, and electrically connected to the substrate, and
wherein the converter further comprises at least one support ring that is disposed between the horizontal portion of the terminal line and the substrate, that surrounds at least a portion of an outer circumferential surface of the vertical portion, and that supports at least a portion of the horizontal portion, the at least one support ring defining a height of the inductor from the substrate.

16. The converter of claim 15, wherein the substrate is positioned at a height between a center of the inductor and a lower end of the inductor.

17. The converter of claim 15, wherein at least a portion of the heat sink is disposed at a position facing the inductor.

18. A control box for an air conditioner, the control box comprising:
a case;
a substrate disposed inside the case;
an inductor disposed at a first side of the substrate, the inductor comprising a core and a coil that is wound around the core;
a switching element that is disposed at the substrate and in thermal contact with an inner surface of the case, the switching element being electrically connected to the substrate and configured to control a flow of current to the substrate; and
a heat sink that is coupled to an outer surface of the case and in contact with the switching element, the heat sink being configured to absorb heat generated from the switching element,
wherein the substrate defines a lead-in hole that receives at least a portion of the inductor at the first side of the substrate,
wherein the inductor further comprises a terminal line that is electrically connected to the substrate,
wherein the terminal line comprises:
a horizontal portion that protrudes from the coil and extends in a horizontal direction parallel to the substrate, and
a vertical portion that is bent from the horizontal portion, and electrically connected to the substrate,
wherein the control box further comprises at least one support ring that is disposed between the horizontal portion of the terminal line and the substrate, that surrounds at least a portion of an outer circumferential surface of the vertical portion, and that supports at least a portion of the horizontal portion, the at least one support ring defining a height of the inductor from the substrate.

19. The control box of claim 18, wherein at least a portion of the heat sink is disposed at a position facing the inductor.

20. The control box of claim 18, wherein the inductor comprises a retracted portion that extends downward toward the heat sink through the substrate, and
wherein the control box further comprises a support member configured to exchange heat between the inductor and the case, the support member having:
a first surface that is in contact with the inner surface of the case, and a second surface that supports at least a portion of the retracted portion of the inductor.

\* \* \* \* \*